(12) United States Patent
Xu (10) Patent No.: US 12,308,577 B2
(45) Date of Patent: May 20, 2025

(54) TERMINAL MODULE AND ELECTRICAL CONNECTOR INCLUDING THE TERMINAL MODULE

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventor: Yong-Chun Xu, Kunshan (CN)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 422 days.

(21) Appl. No.: 17/830,485

(22) Filed: Jun. 2, 2022

(65) Prior Publication Data
US 2022/0393406 A1    Dec. 8, 2022

(30) Foreign Application Priority Data

Jun. 5, 2021  (CN) .......................... 202110627130.8

(51) Int. Cl.
*H01R 13/658*   (2011.01)
*H01R 13/518*   (2006.01)
(Continued)

(52) U.S. Cl.
CPC ....... *H01R 13/6587* (2013.01); *H01R 13/518* (2013.01); *H01R 13/6582* (2013.01)

(58) Field of Classification Search
CPC ............ H01R 13/6587; H01R 13/6586; H01R 13/6585; H01R 13/6582; H01R 13/6581; H01R 13/658; H01R 12/00; H01R 12/523; H01R 12/526; H01R 12/585; H01R 12/596
(Continued)

(56) References Cited

U.S. PATENT DOCUMENTS

5,269,708 A  * 12/1993 DeYoung ................. H04Q 1/13
                                                      439/676
6,479,765 B2 * 11/2002 Ramey ................... H05K 1/117
                                                      174/262
(Continued)

*Primary Examiner* — Harshad C Patel
(74) *Attorney, Agent, or Firm* — Ming Chieh Chang (57) ABSTRACT

A terminal module includes a circuit board having: an upper layer having a row of upper conductive pads; a lower layer having a row of lower conductive pads; a first upper signal layer having upper conductive vias and a first upper inner conductive trace connecting with corresponding upper conductive pads through the upper conductive vias; a first lower signal layer having lower conductive vias and a first lower inner conductive trace connecting with corresponding lower conductive pads through the lower conductive vias; and a ground isolation layer; and a row of upper mating terminals connected to the upper conductive pad, and a row of lower mating terminals connected to the lower conductive pad; wherein neither the upper conductive via nor the lower conductive via passes through the ground isolation layer, and the ground isolation layer shields electromagnetic interference between the upper mating terminals and the lower mating terminals.

11 Claims, 11 Drawing Sheets

(51) Int. Cl.
*H01R 13/6582* (2011.01)
*H01R 13/6587* (2011.01)

(58) Field of Classification Search
USPC .................................................... 439/607.7
See application file for complete search history.

(56) References Cited

U.S. PATENT DOCUMENTS

| | | | | |
|---|---|---|---|---|
| 6,504,726 B1 * | 1/2003 | Grabinger | ............ | H05K 1/0228 |
| | | | | 361/796 |
| 7,241,181 B2 * | 7/2007 | Machado | ............ | H01R 13/514 |
| | | | | 439/541.5 |
| 7,288,001 B1 * | 10/2007 | Aekins | ................ | H01R 4/2429 |
| | | | | 439/540.1 |
| 7,336,502 B1 * | 2/2008 | Goergen | ............ | H05K 1/116 |
| | | | | 361/780 |
| 7,544,899 B2 * | 6/2009 | Kamada | ............ | H05K 3/3447 |
| | | | | 174/262 |
| 7,897,880 B1 * | 3/2011 | Goergen | ............ | H05K 1/0237 |
| | | | | 174/265 |
| 8,011,950 B2 * | 9/2011 | McGrath | ............ | H01R 13/6594 |
| | | | | 439/497 |
| 8,319,116 B2 * | 11/2012 | Martinez-Vargas | ... | H05K 1/116 |
| | | | | 174/262 |
| 8,361,896 B2 * | 1/2013 | De Geest | ............ | H05K 1/0231 |
| | | | | 438/607 |
| 8,579,661 B2 * | 11/2013 | Zhang | ................ | H01R 13/6587 |
| | | | | 439/540.1 |
| 8,928,849 B2 * | 1/2015 | Horino | ................ | G02F 1/13452 |
| | | | | 349/149 |
| 9,022,806 B2 * | 5/2015 | Cartier, Jr. | ......... | H01R 13/6587 |
| | | | | 439/607.07 |
| 9,196,429 B2 * | 11/2015 | Sun | ...................... | H01H 1/0036 |
| 9,698,535 B2 * | 7/2017 | Cornelius | .......... | H01R 13/6473 |
| 10,687,414 B2 * | 6/2020 | Fujioka | .................. | H05K 1/115 |
| 11,637,403 B2 * | 4/2023 | Cartier, Jr. | ............. | H05K 1/141 |
| | | | | 439/607.07 |
| 2012/0247826 A1 * | 10/2012 | Chow | .................. | H05K 1/0218 |
| | | | | 174/350 |
| 2016/0056596 A1 * | 2/2016 | Gao | ....................... | H01R 24/64 |
| | | | | 439/38 |
| 2016/0344139 A1 | 11/2016 | O'Young et al. | | |
| 2018/0269633 A1 | 9/2018 | Rascon et al. | | |

* cited by examiner

TERMINAL MODULE AND ELECTRICAL CONNECTOR INCLUDING THE TERMINAL MODULE

BACKGROUND OF THE INVENTION

1. Field of the Invention

The present invention relates generally to a terminal module and an electrical connector including the terminal module, and more particularly to a terminal module and an electrical connector including a circuit board.

2. Description of Related Arts

U.S. Pat. No. 8,579,661 discloses an electrical connector including a terminal module having an upper mating terminal and a lower mating terminal. The upper and lower mating terminals are isolated by metal sheets and plastic to reduce the crosstalk therebetween. The metal sheet and plastic add cost of electrical connectors and occupies the connector space.

An improved terminal module and an electrical connector including the terminal module are desired.

SUMMARY OF THE INVENTION

A main object of the present invention is to provide a terminal module and an electrical connector including the terminal module that can shield electromagnetic interference between mating terminals and is less costly and space-saving.

To achieve the above-mentioned object, a terminal module comprises: a circuit board having: an upper layer having a row of upper conductive pads; a lower layer disposed opposite to the upper layer and having a row of lower conductive pads; a first upper signal layer disposed under the upper layer and having upper conductive vias and a first upper inner conductive trace connecting with corresponding upper conductive pads through the upper conductive vias; a first lower signal layer disposed on the lower layer and having lower conductive vias and a first lower inner conductive trace connecting with corresponding lower conductive pads through the lower conductive vias; and a ground isolation layer between the first upper signal layer and the first lower signal layer; and a plurality of mating terminals connected to the circuit board, the mating terminals including: a row of upper mating terminals connected to the upper conductive pad, and a row of lower mating terminals connected to the lower conductive pad; wherein neither the upper conductive via nor the lower conductive via passes through the ground isolation layer, and the ground isolation layer shields electromagnetic interference between the upper mating terminals and the lower mating terminals.

To achieve the above-mentioned object, an electrical connector to be mated with a mating connector comprises an insulating housing and a terminal module received in the insulating housing, the terminal module comprising: a circuit board having: an upper layer having a row of upper conductive pads; a lower layer disposed opposite to the upper layer, and having a row of lower conductive pads; a first upper signal layer under the upper layer having upper conductive vias penetrating and a first upper inner conductive trace connecting with the corresponding upper conductive pads through the upper conductive vias; a first lower signal layer on the lower layer having lower conductive vias and a first lower inner conductive trace connecting with the corresponding lower conductive pads through the lower conductive vias; and a ground isolation layer between the first upper signal layer and the first lower signal layer; and a plurality of mating terminals connected to the circuit board, the mating terminals including: a row of upper mating terminals connected to the upper conductive pad; and a row of lower mating terminals connected to the lower conductive pad; wherein neither the upper conductive via nor the lower conductive via passes through the ground isolation layer, and the ground isolation layer shields electromagnetic interference between the upper mating terminals and the lower mating terminals.

Compared to prior art, the terminal module in the present invention, the upper conductive via hole and the lower conductive via hole do not pass through the ground isolation layer so that the ground isolation layer can shield the electromagnetic interference between the upper mating terminals saving the space for designing other components for the electrical connector.

DETAILED DESCRIPTION OF THE PREFERRED EMBODIMENT

Referring to FIGS. 1-10, an electrical connector 100 in accordance with the present invention is shown. It can be inserted and matched with a mating connector (not shown), and can be mounted on an external circuit board 900. For ease of understanding, in the present invention, the mating direction of the electrical connector 100 and the mating connector is the front-rear direction, the direction of mounting on the external circuit board 900 is the up-down direction, and the direction perpendicular to the front-rear direction and the up-down direction is the left-right direction. The left-right direction is the lateral direction.

Figure 1:
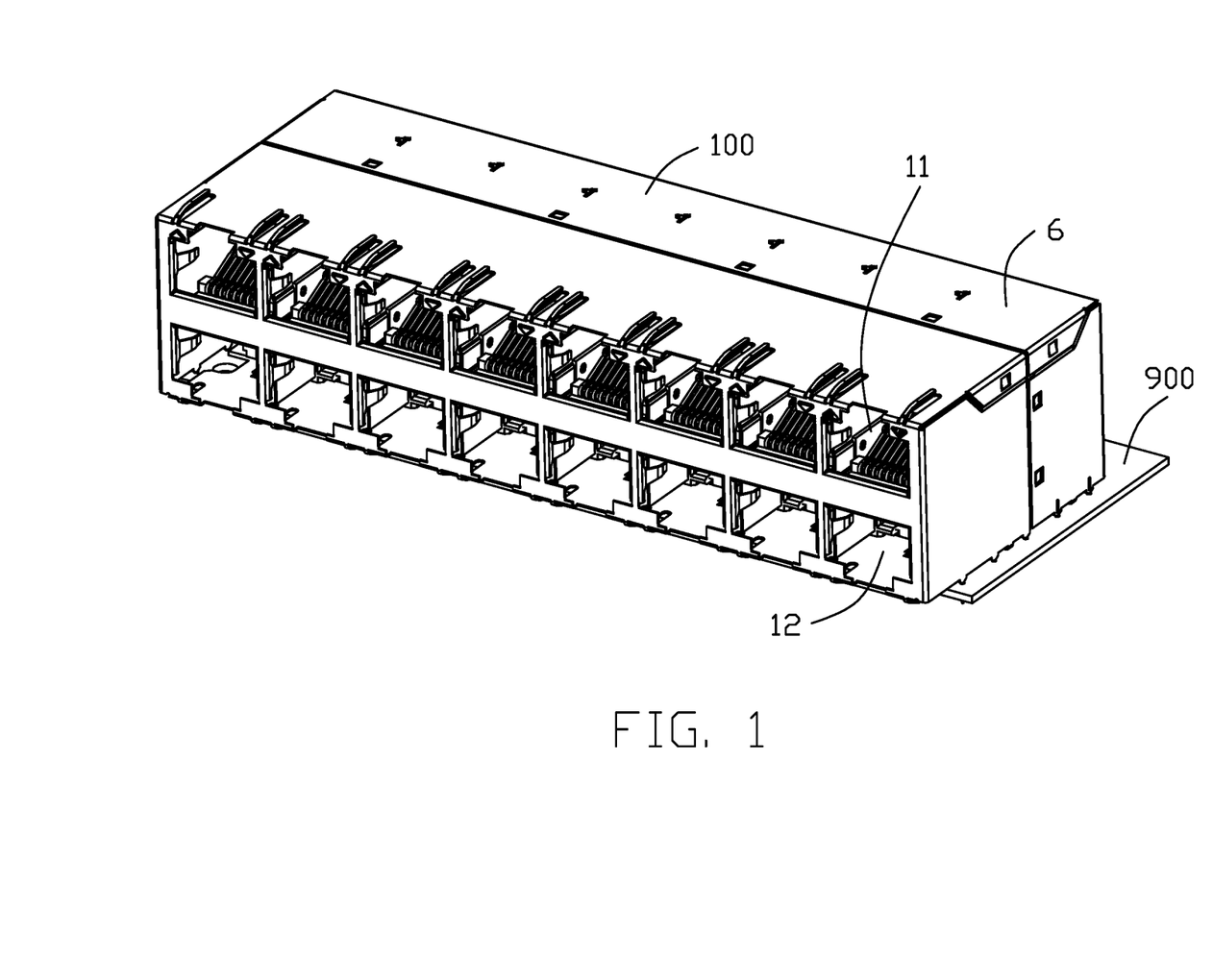
FIG. 1 is a perspective view of an electrical connector in accordance with the present invention and an external circuit board on which it is mounted.

The electrical connector 100 includes an insulating body (not shown), a terminal module 2 at least partially accommodated in the insulating body, and a metal shielding shell 6 covering the insulating body and the terminal module 2. The electrical connector 100 includes an upper mating cavity 11 and a lower mating cavity 12 that are aligned in the up-down direction. Different mating connectors can be accommodated in the corresponding upper mating cavity 11 and the lower mating cavity 12 to match with the electrical connector 100. In the embodiment of the present invention, the electrical connector 100 includes eight upper mating cavities 11 and eight lower mating cavities 12.

Figure 2:
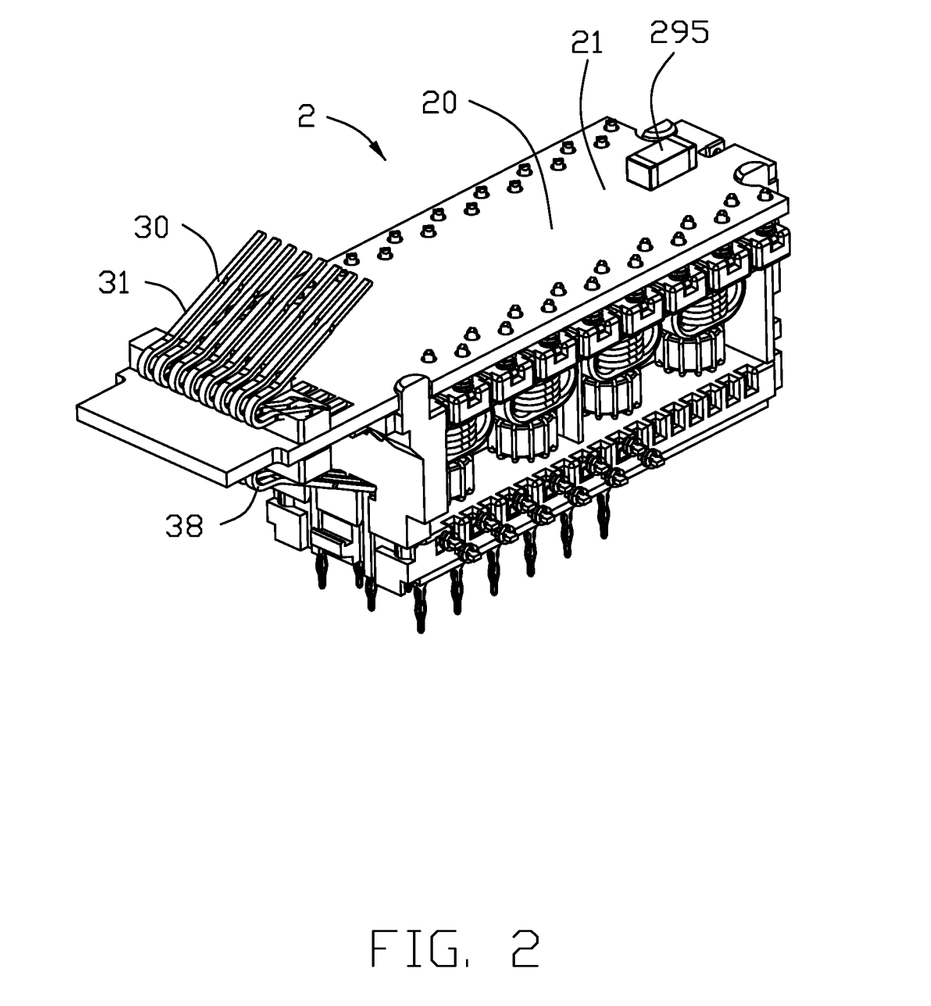
FIG. 2 is a perspective view of the terminal module of the electrical connector in FIG. 1.
Figure 3:
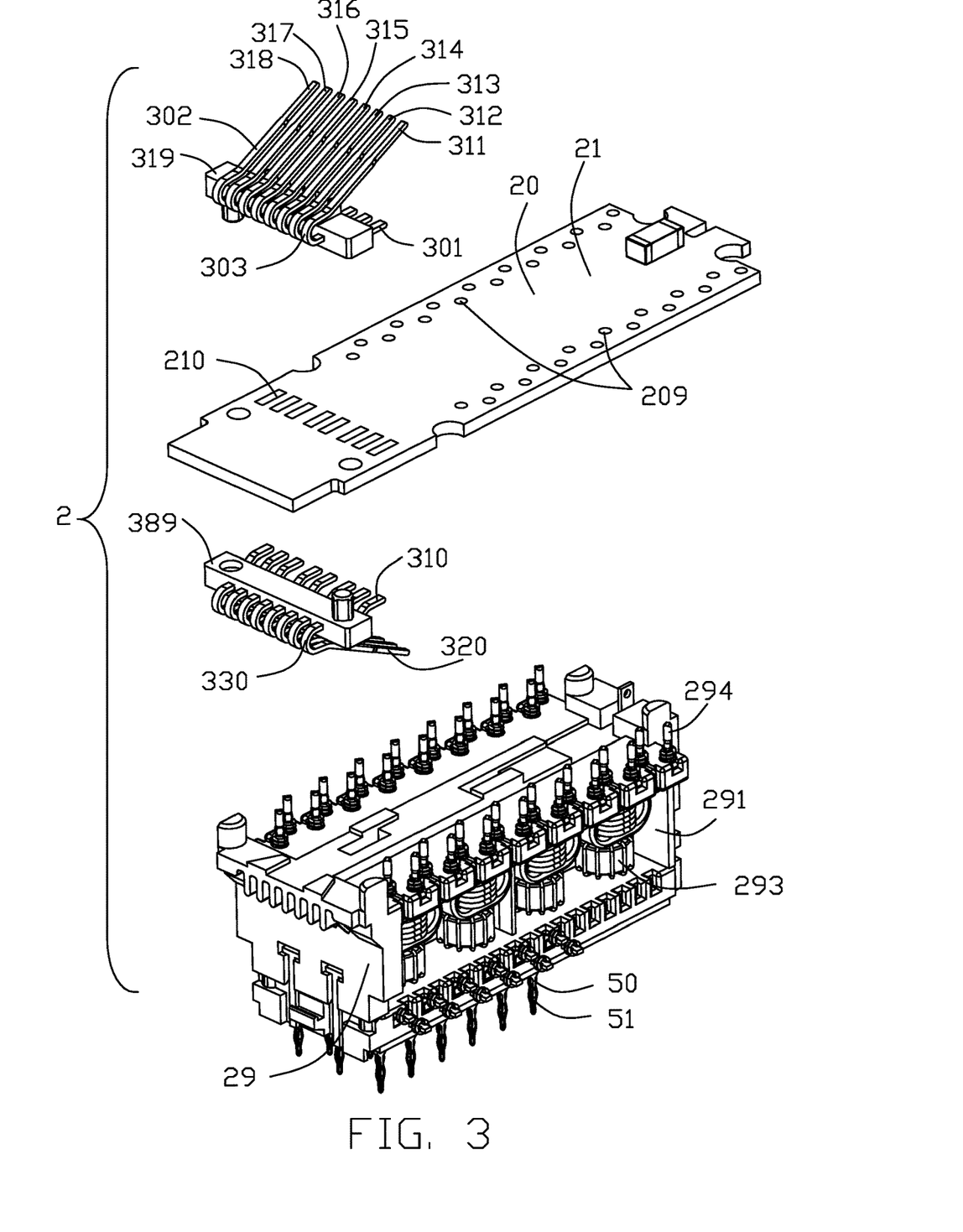
FIG. 3 is an exploded view of the terminal module of the electrical connector in FIG. 2.

The terminal module 2 includes a horizontally arranged circuit board 20, a plurality of mating terminals 30 soldered to the front of the circuit board 20 that can be matched with the mating connectors, and a plurality of pin terminals 50 extending downward and mounted on the external circuit board 900.

The circuit board 20 includes an upper layer 21 and a lower layer 28 on the opposite side of the upper layer 21. A row of upper conductive pads 210 is provided on the outer surface of the front part of the upper layer 21. The row of upper conductive pads 210 includes first to eighth upper conductive pads 211, 212, 213, 214, 215, 216, 217, and 218 arranged in sequence along the lateral direction. A row of lower conductive pads 280 is provided on front part of the outer surface of the lower layer 28. The row of lower conductive pads 280 includes first to eighth lower conductive pads 281, 282, 283, 284, 258, 286, 287, 288 arranged in sequence along the lateral direction. The mating terminals 30 include a row of upper mating terminals 31 arranged on the upper layer 21 and a row of lower mating terminals 38 arranged on the lower layer 28 of the circuit board 20. The upper mating terminals 31 include first upper terminal to an eighth upper terminal 311, 312, 313, 314, 315, 316, 317, 318 arranged in sequence along the lateral direction. The lower mating terminals 38 include first to eighth lower terminals 381, 382, 383, 384, 385, 386, 387, and 388 arranged in sequence along the lateral direction. The first to eighth upper terminals can be soldered to the corresponding first to eighth upper conductive pads. The first to eighth lower terminals can be soldered to the corresponding first to eighth lower conductive pads. Each of the upper mating terminals 31 includes an upper soldering portion 301 soldered on the corresponding upper conductive pad 210, an upper mating portion 302 extending forward into the upper mating cavity 11, and an upper connecting portion 303 connecting the upper soldering portion 301 and the upper mating portion 302. The first upper terminal 311 and the second upper terminal 312 can be used to transmit a pair of differential signals. The third upper terminal 313 and the sixth upper terminal 316 can be used to transmit a pair of differential signals. The fourth upper terminal 314 and the fifth upper terminal 315 can be used to transmit a pair of differential signals. The seventh upper terminal 317 and the eighth upper terminal 318 can be used to transmit a pair of differential signals. In this way, the fourth upper terminal 314 and the fifth upper terminal 315 are located between the third upper terminal 313 and the sixth upper terminal 316 in the lateral direction. Each of the lower mating terminals 38 includes a lower soldering portion 310 soldered on the corresponding lower conductive pad 280, a lower mating portion 320 extending forward into the lower mating cavity 12, and a lower connecting portion 330 connecting the lower soldering portion 310 and the lower mating portion 320. The first lower terminal 381 and the second lower terminal 382 can be used to transmit a pair of differential signals. The third lower terminal 383 and the sixth lower terminal 386 be used to transmit a pair of differential signals. The fourth lower terminal 384 and the fifth lower terminal 385 can be used to transmit a pair of differential signals. The seventh lower terminal 387 and the eighth lower terminal 388 can be used to transmit a pair of differential signals. In this way, the fourth lower terminal 384 and the fifth lower terminal 385 are located between the third lower terminal 383 and the sixth lower terminal 386 in the lateral direction.

Figure 11:
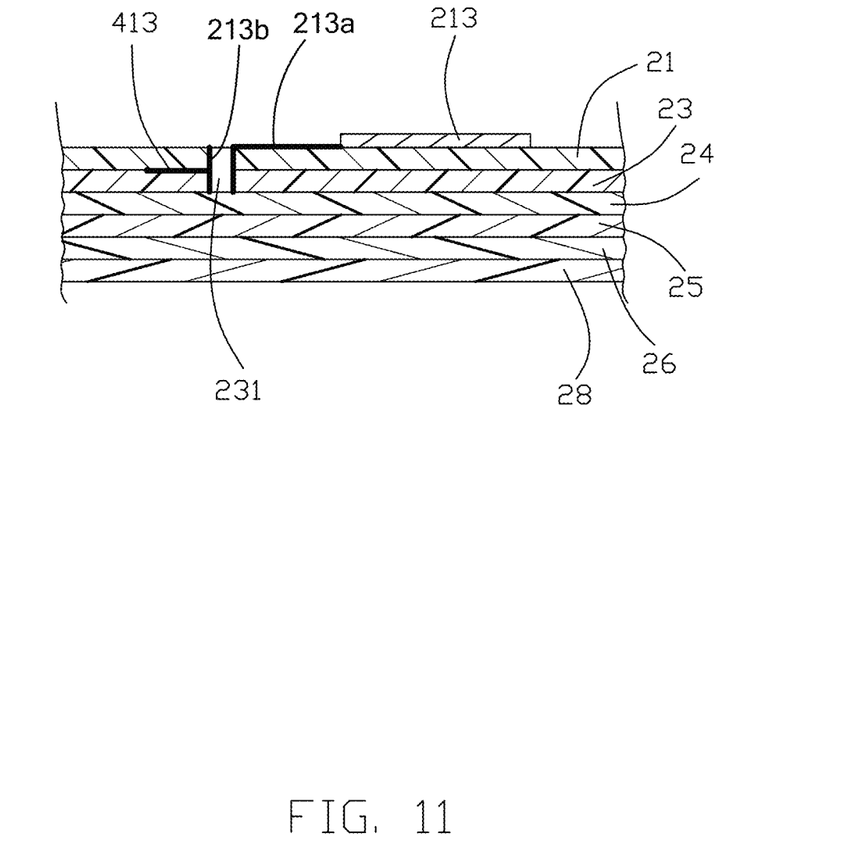
FIG. 11 is a cross-sectional view of the circuit board.

The circuit board 20 further comprises a first upper signal layer 23 located under the upper layer 21, a first lower signal layer 26 located on the lower layer 28, and a ground isolation layer between the first upper signal layer 23 and the first lower signal layer 26. The ground isolation layer includes an upper ground isolation layer 24 located on the lower side of the first upper signal layer 23 and a lower ground isolation layer 25 located on the upper side of the first lower signal layer 26. The first upper signal layer 23 is provided with upper conductive vias 230 penetrating up and down and first upper inner conductive traces 203. The first upper inner conductive trace 203 electrically connects with the corresponding third and sixth upper conductive pads 213 and 216 through the upper conductive vias 230 as well as conductive traces 213*a* and 216*a* and conductive vias 213*b* and 216*b* on the layer 21, respectively. as shown in FIG. 11. The first lower signal layer 26 is provided with a lower conductive vias 260 penetrating up and down and a first lower inner conductive trace 206. The first lower inner conductive trace 206 electrically connects with the corresponding lower third and sixth conductive pads 283 and 286 through the lower conductive vias 260 as well as conductive traces 283*a* and 286*a* and conductive vias 283*b* and 286*b* on the layer 28, respectively. The upper conductive via 230 and the lower conductive via 260 do not pass through the ground isolation layer so that the ground isolation layer shields the electromagnetic interference between the upper mating terminals 31 and the lower mating terminals 38. The circuit board 20 further includes a second upper signal layer 22 between the upper layer 21 and the first upper signal layer 23, a second lower signal layer 27 located between the lower layer 28 and the first lower signal layer 26. The second upper signal layer 22 is provided with a second upper outer conductive trace 202. The second lower signal layer 27 is provided with a second lower outer conductive trace 207. The second upper outer conductive trace 202 is directly connected to the corresponding upper conductive pad 210. The second lower outer conductive trace 207 is in direct communication with the lower conductive pad 280.

The circuit board 20 includes first to eighth upper conductive traces 411, 412, 413, 414, 415, 416, 417, 418 that are electrically connected to the first to eighth upper conductive pads, and first to eighth lower conductive traces 421, 422, 423, 424, 425, 426, 427, 428 that are electrically connected to the first to eighth lower conductive pads. The third upper conductive trace 413 and the sixth upper conductive trace 416 are disposed on the first upper signal layer 23 as the first upper inner conductive trace 203. The first upper conductive trace 411, the second upper conductive trace 412, the fourth upper conductive trace 414, the fifth upper conductive trace 415, the seventh upper conductive trace 417, and the eighth upper conductive trace 418 are provided on the second upper signal layer as the second upper outer conductive trace 202. Similarly, the third lower conductive trace 423 and the sixth lower conductive trace 426 are disposed on the first lower signal layer 26 as the first lower inner conductive trace 206, and the other lower conductive traces are disposed on the second lower signal layer 27 as the second lower outer conductive trace 207.

Figure 6:
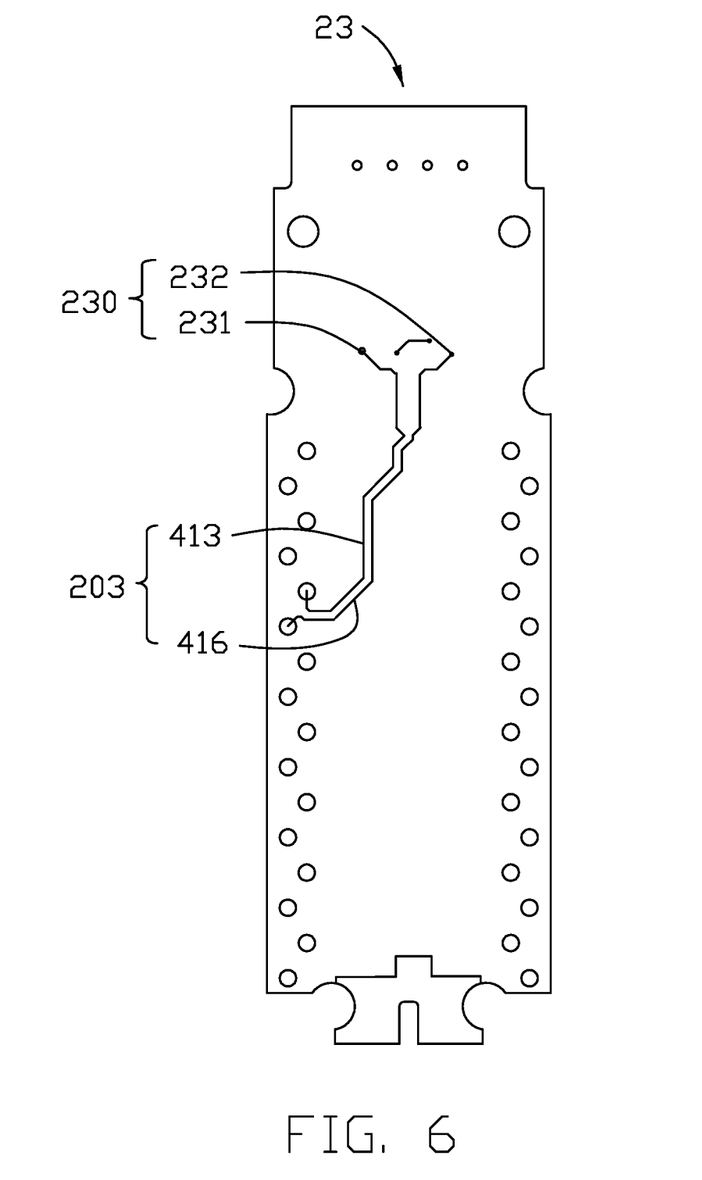
FIG. 6 is front projection of the first upper signal layer to the upper layer of the circuit board of the terminal module in FIG. 3.
Figure 7:
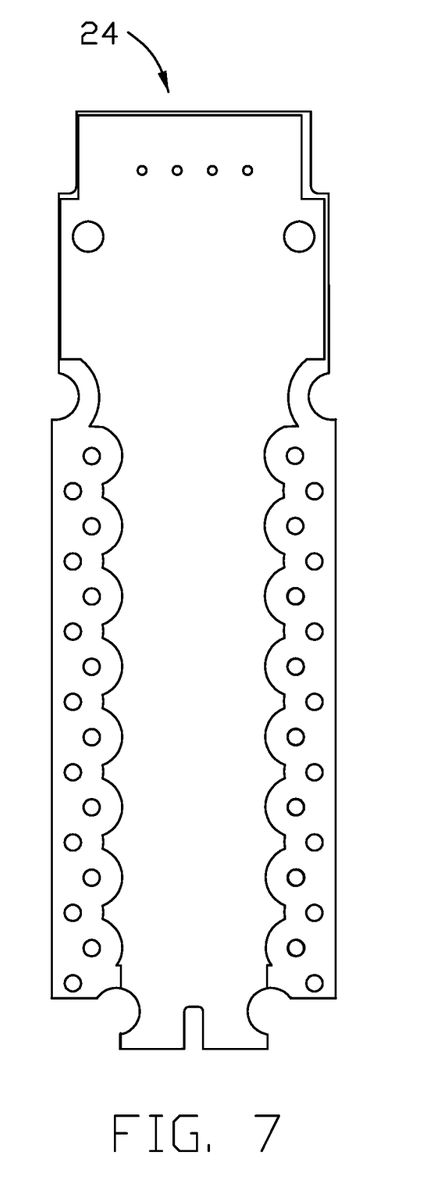
FIG. 7 is front view of the second upper signal layer of the circuit board of the terminal module in FIG. 3.
Figure 9:
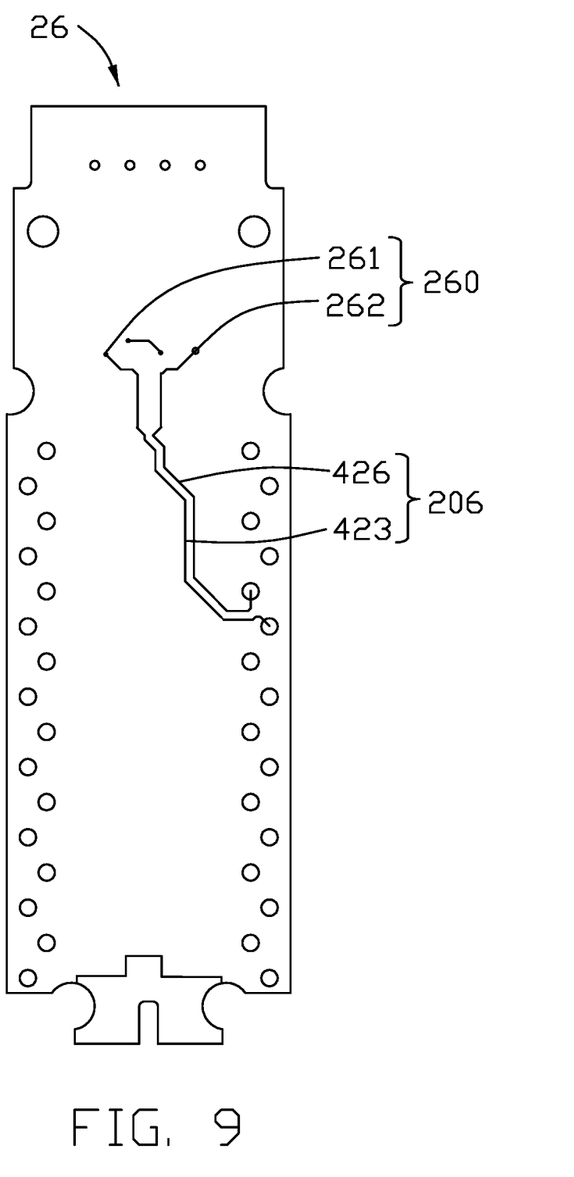
FIG. 9 is front projection of the second lower signal layer to the lower layer of the circuit board of the terminal module in FIG. 3.
Figure 10:
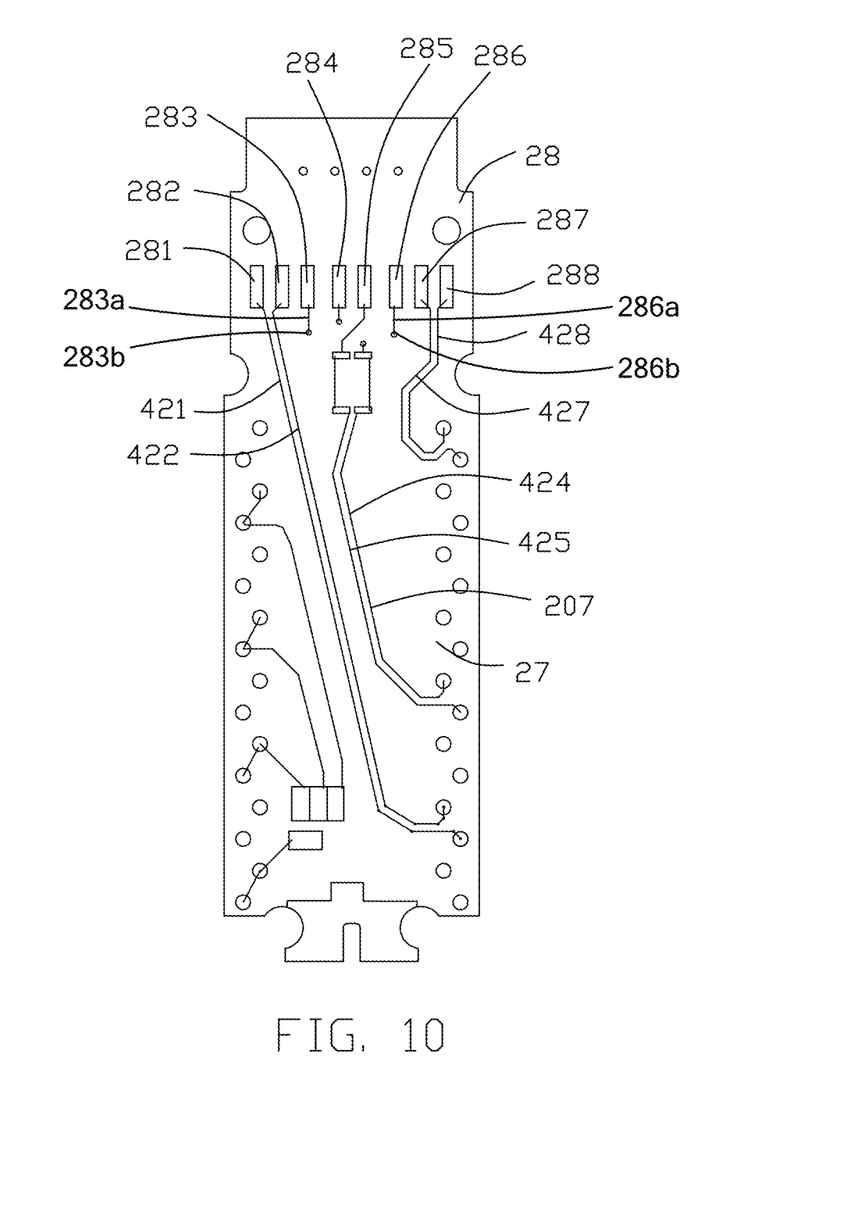
FIG. 10 is front view of the lower layer of the circuit board of the terminal module in FIG. 3.

The upper conductive vias 230 includes a first upper conductive via 231 connected to the third upper conductive trace 413 and a second upper conductive via 232 connected to the sixth upper conductive trace 416. The lower conductive vias 260 includes a first lower conductive via 261 connected to the third lower conductive trace 423 and a second lower conductive via 262 connected to the sixth lower conductive trace 426. The third upper terminal 313 is electrically connected to the third upper conductive trace 413 through the first upper conductive via 231. The sixth upper terminal 316 is electrically connected to the sixth upper conductive trace 416 through the second upper conductive via 232. The fourth upper terminal 314 and the fifth upper terminal 315 are electrically connected to the corresponding fourth upper conductive trace 414 and fifth upper conductive trace 415. The fourth upper conductive trace 414 and the fifth upper conductive trace 415 are arranged close to each other in the lateral direction and cross each other for high-speed signal transmission. The third upper conductive trace 413 and the sixth upper conductive trace 416 are close to each other in the lateral direction for high-speed signal transmission. The first upper conductive trace 411 and the second upper conductive trace 412 are close to each other, and the seventh upper conductive trace 417 and the eighth upper conductive trace 418 are close to each other in the lateral direction.

Figure 8:
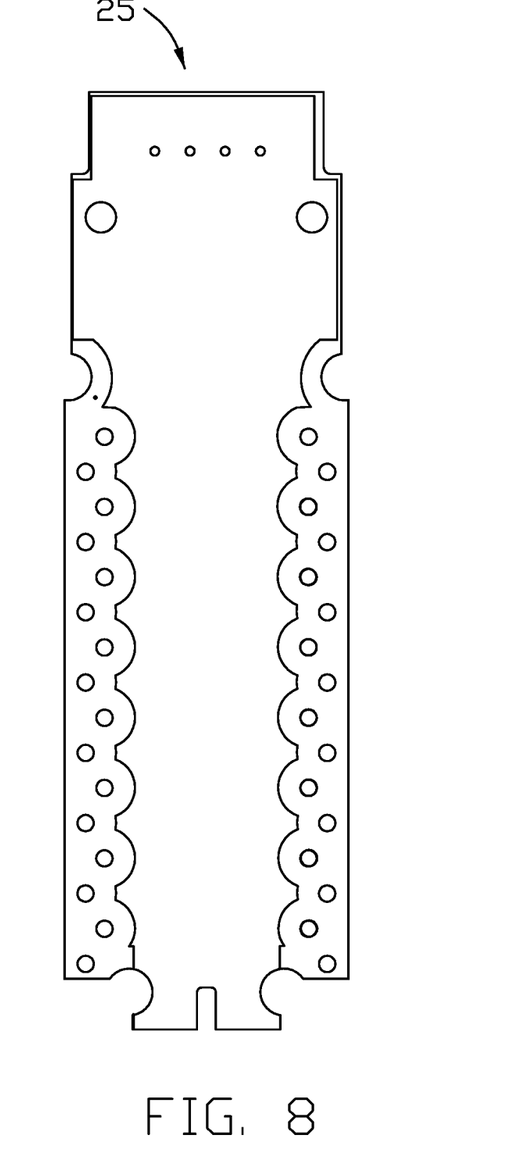
FIG. 8 is front view of the second lower signal layer of the circuit board of the terminal module in FIG. 3.

The third lower terminal 383 is electrically connected to the third lower conductive trace 423 through the first lower conductive via 261, the sixth lower terminal 386 is electrically connected to the sixth lower conductive trace 426 through the second lower conductive via 262. The fourth lower terminal 384 and the fifth lower terminal 385 are electrically connected to the corresponding fourth lower conductive trace 424 and fifth lower conductive trace 425. The fourth lower conductive traces 424 and the fifth lower conductive traces 425 are adjacent to each other in the lateral direction and arranged to cross each other.

The upper conductive via 230 penetrates the first upper signal layer 23 and the second upper signal layer 22 in the up-down direction but does not penetrate the upper ground isolation layer 24. The lower conductive via 260 penetrates the first lower signal layer 26 and the second lower signal layer 27 in the up-down direction but does not penetrate the lower ground isolation layer 25. The upper ground isolation layer 24 and the lower ground isolation layer 25 are not provided with any conductive vias in the projection area where the upper mating terminals 31 are projected downward on the circuit board 20 and the lower mating terminals 38 are projected upward on the circuit board 20, The terminal module 2 further includes an upper fixing member 319 for fixing the row of upper mating terminals 31 and a lower fixing member 389 for fixing the row of lower mating terminals 38. The upper mating terminal 31 and the upper fixing member 319 are integrally formed. The lower mating terminal 38 is integrally formed with the lower fixing member 389.

Figure 4:
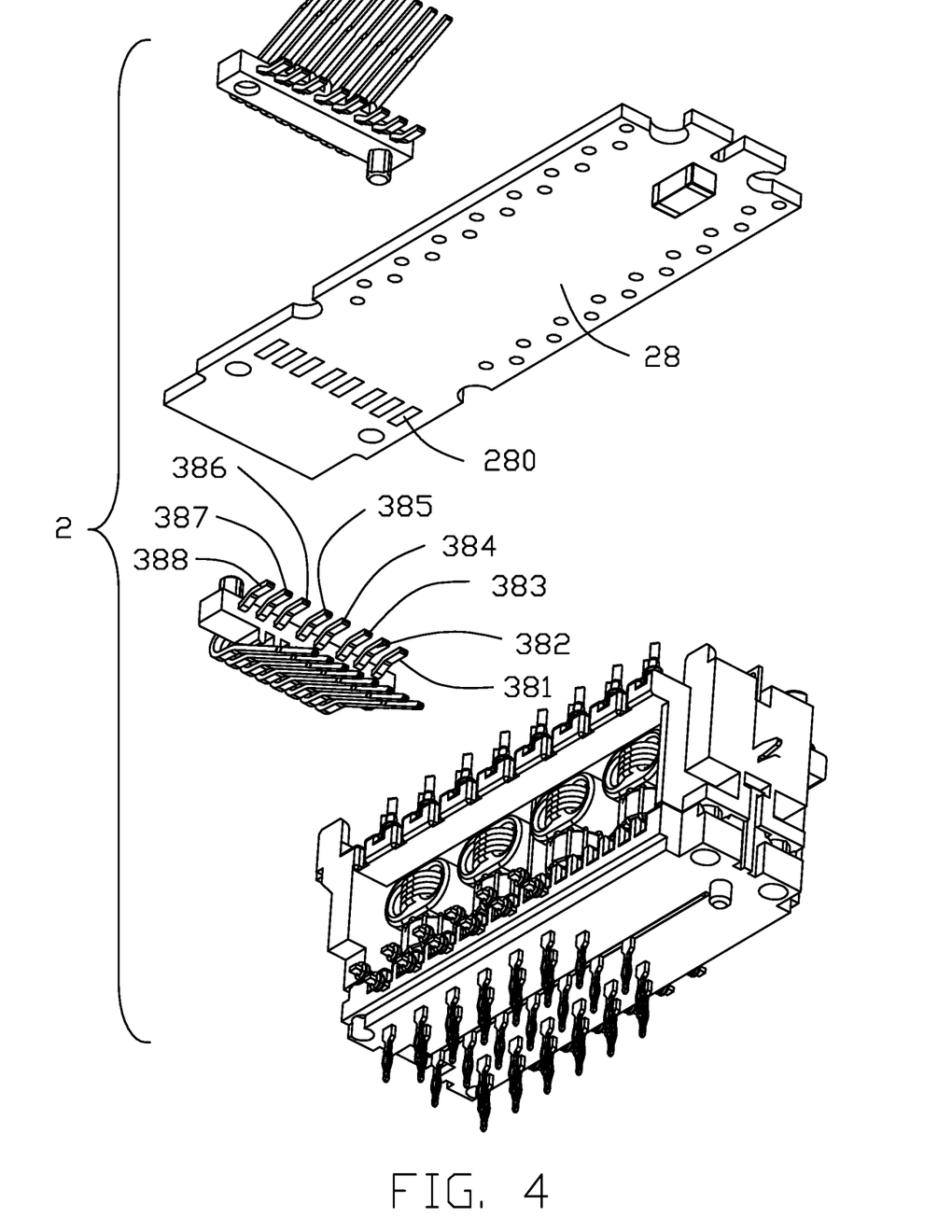
FIG. 4 is another exploded view of the terminal module of the electrical connector in FIG. 3.
Figure 5:
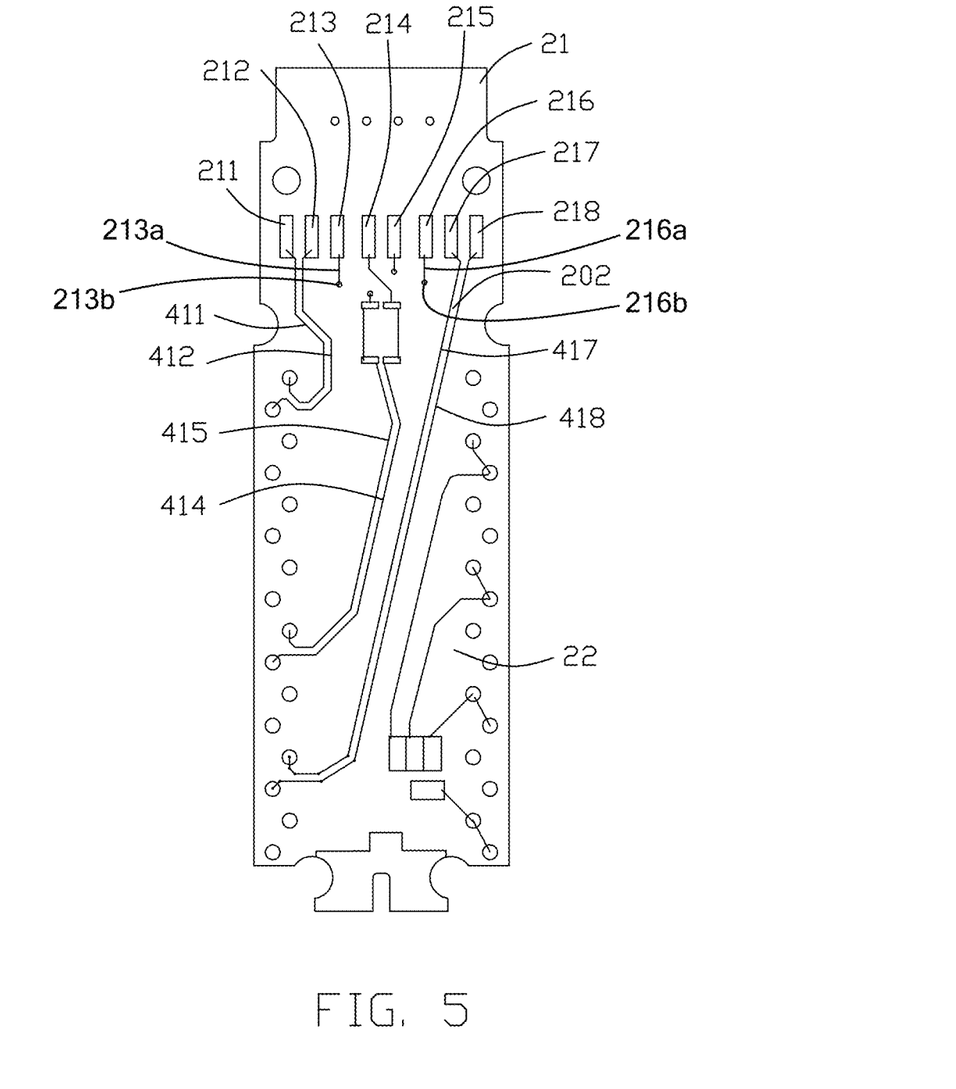
FIG. 5 is the front view of the upper layer of the circuit board of the terminal module in FIG. 3.

The terminal module 2 further includes an insulating carrier 29 located under the rear of the circuit board 20 with an accommodating cavity 291, The magnetic module 293 accommodated in the accommodating cavity 291, and intermediate terminals 294 mounted on the insulating carrier 29. There are two rows of terminal holes 209 along the front and rear directions on the left and right sides of the circuit board 20. The intermediate terminals 294 extend upward and are installed in the corresponding terminal hole 209 of the circuit board 20. Each conductive trace is connected to the corresponding intermediate terminal 294 in the terminal hole 209. Each of the pin terminal 50 is mounted on the lower end of the insulating carrier 29, and includes a mounting foot 51 extending downwardly out of the insulating carrier 29 that can be mounted on the external circuit board 900. Electronic components such as capacitors and resistors 295 may also be provided on the circuit board 20.

In the present invention, the upper conductive vias 230 and the lower conductive vias 260 of the terminal module do not pass through the ground isolation layer, so that the ground isolation layer shields the electromagnetic interference between the upper mating terminals 31 and the lower mating terminals 38, there is no need for additional metal sheet shielding isolation, thereby reducing the cost of the materials of the terminal module and the electrical connector 100 and increasing the space of the connector.

What is claimed is:

1. A terminal module comprising:
    a circuit board having:
        an upper layer having a row of upper conductive pads;
        a lower layer disposed opposite to the upper layer and having a row of lower conductive pads;
        a first upper signal layer disposed under the upper layer and having upper conductive vias and first upper inner conductive traces connecting with corresponding upper conductive pads through the upper conductive vias;
        a first lower signal layer disposed on the lower layer and having lower conductive vias and first lower inner conductive traces connecting with corresponding lower conductive pads through the lower conductive vias; and
        a ground isolation layer between the first upper signal layer and the first lower signal layer; and
    a plurality of mating terminals connected to the circuit board, the mating terminals including:
        a row of upper mating terminals connected to the upper conductive pads, and
        a row of lower mating terminals connected to the lower conductive pads; wherein
    neither the upper conductive via nor the lower conductive via passes through the ground isolation layer, and the ground isolation layer shields electromagnetic interference between the upper mating terminals and the lower mating terminals; and
    the row of upper mating terminals include first through eighth terminals with the third terminal and the sixth terminal constituting a differential pair and being electrically connected to the first upper conductive traces, and the row of lower mating terminals include first through eighth terminals with the third terminal and the sixth terminal constituting a differential pair and being electrically connected to the first lower conductive traces.

2. The terminal module as claimed in claim 1, wherein the circuit board further includes a second upper signal layer between the upper layer and the first upper signal layer, and the second upper signal layer is provided with second upper outer conductive traces which are directly connected to corresponding upper conductive pads.

3. The terminal module as claimed in claim 2, wherein the circuit board further includes a second lower signal layer between the lower layer and the first lower signal layer, and the second lower signal layer is provided with second lower outer conductive traces which is are directly connected to corresponding lower conductive pads.

4. The terminal module as claimed in claim 3, wherein the ground isolation layer includes an upper ground isolation layer and a lower ground isolation layer, the upper ground isolation layer is located on the lower side of the first upper signal layer, and the lower ground isolation layer is located on the upper side of the first lower signal layer.

5. The terminal module as claimed in claim 4, wherein the upper conductive via penetrates the first upper signal layer and the second upper signal layer but does not penetrate the upper ground isolation layer, and the lower conductive via penetrates the first lower signal layer and the second lower signal layer but does not penetrate the lower ground isolation layer.

6. The terminal module as claimed in claim 4, wherein neither the upper ground isolation layer nor the lower ground isolation layer are provided with any conductive via on the projection area of the mating terminals on the circuit board.

7. The terminal module as claimed in claim 2, wherein the fourth and fifth terminals of the row of upper mating terminals constitute a differential pair and are electrically connected to the second upper inner conductive traces.

8. The terminal module as claimed in claim 7, wherein the first upper conductive traces corresponding to the third and sixth terminals are adjacent to each other.

9. An electrical connector to be mated with a mating connector, comprising:
    an insulating housing; and
    a terminal module received in the insulating housing, the terminal module comprising:
        a circuit board having:
            an upper layer having a row of upper conductive pads;
            a lower layer disposed opposite to the upper layer, and having a row of lower conductive pads;
            a first upper signal layer under the upper layer having upper conductive vias penetrating and first upper inner conductive traces connecting with the corresponding upper conductive pads through the upper conductive vias;
            a first lower signal layer on the lower layer having lower conductive vias and first lower inner conductive traces connecting with the corresponding lower conductive pads through the lower conductive vias; and
            a ground isolation layer between the first upper signal layer and the first lower signal layer; and
        a plurality of mating terminals connected to the circuit board, the mating terminals including:
            a row of upper mating terminals connected to the upper conductive pads; and
            a row of lower mating terminals connected to the lower conductive pads; wherein
neither the upper conductive via nor the lower conductive via passes through the ground isolation layer, and the ground isolation layer shields electromagnetic interference between the upper mating terminals and the lower mating terminals; and
the row of upper mating terminals include first through eighth terminals with the third terminal and the sixth terminal constituting a differential pair and being electrically connected to the first upper conductive traces, and the row of lower mating terminals include first through eighth terminals with the third terminal and the sixth terminal constituting a differential pair and being electrically connected to the first lower conductive traces.

10. The electrical connector as claimed in claim 9, wherein the ground isolation layer does not have any conductive vias on the projection area of the mating terminals on the circuit board.

11. The electrical connector as claimed in claim 9, wherein the insulating housing includes an upper mating cavity and a lower mating cavity, the row of upper mating terminals are received in the upper mating cavity, and the row of lower mating terminals are received in the lower mating cavity.

\* \* \* \* \*